United States Patent [19]
Wang et al.

[11] Patent Number: 5,754,796
[45] Date of Patent: May 19, 1998

[54] BUS PORT TRANSMISSION DEVICE

[76] Inventors: Daniel Wang, 12F, No. 15, Keelung Rd., Sec. 2; David Yow, 5F, No. 2, Lane 162, Tzu-Chiang St., both of Taipei, Taiwan

[21] Appl. No.: 643,875

[22] Filed: May 7, 1996

[51] Int. Cl.⁶ ........................................ H01J 13/00
[52] U.S. Cl. ................ 395/281; 395/308; 395/309; 395/282; 395/822; 439/74; 439/75
[58] Field of Search ........................... 395/281, 282, 395/283, 309, 835, 836, 882, 884, 892, 847, 848; 439/74, 75, 59, 60–61

[56] References Cited

U.S. PATENT DOCUMENTS

| | | | |
|---|---|---|---|
| 4,998,180 | 3/1991 | McAuliffe et al. | 361/383 |
| 5,276,817 | 1/1994 | Matschke et al. | 395/821 |
| 5,334,030 | 8/1994 | Brilliott | 439/75 |
| 5,440,755 | 8/1995 | Harwer et al. | 395/800 |
| 5,454,725 | 10/1995 | Speiser et al. | 439/61 |
| 5,558,522 | 9/1996 | Dent | 439/65 |
| 5,572,688 | 11/1996 | Sytwu | 395/309 |
| 5,611,057 | 3/1997 | Pecone et al. | 395/282 |
| 5,630,174 | 5/1997 | Stone, III et al. | 395/883 |
| 5,649,121 | 7/1997 | Budman et al. | 395/281 |

*Primary Examiner*—Jack B. Harvey
*Assistant Examiner*—Raymond N. Phan
*Attorney, Agent, or Firm*—Morton J. Rosenberg; David I. Klein; Jun Y. Lee

[57] ABSTRACT

A bus port transmission device for signal transmission between the first extension card and the mother board of a computer system, the device including at least one coupling device, each of the at least one coupling device including a first connector at one end connected to the contact for exclusive signal of one bus interface slot of the first extension card, a second connector connected to the exclusive signal of the corresponding extension slot of the mother board, wherein the signals of the extension slots of the mother board can be transmitted through the at least one coupling device to the interface slots of the first extension card, enabling the interface slots of the first extension card to provide the respective exclusive signals.

3 Claims, 14 Drawing Sheets

BUS PORT TRANSMISSION DEVICE

BACKGROUND OF THE INVENTION

The present invention relates to a bus port transmission device which comprises at least one coupling device adapted for coupling the first extension card to the mother board to enable the bus interface slots of the first extension card to provide the respective bus exclusive signals.

Figure 1:
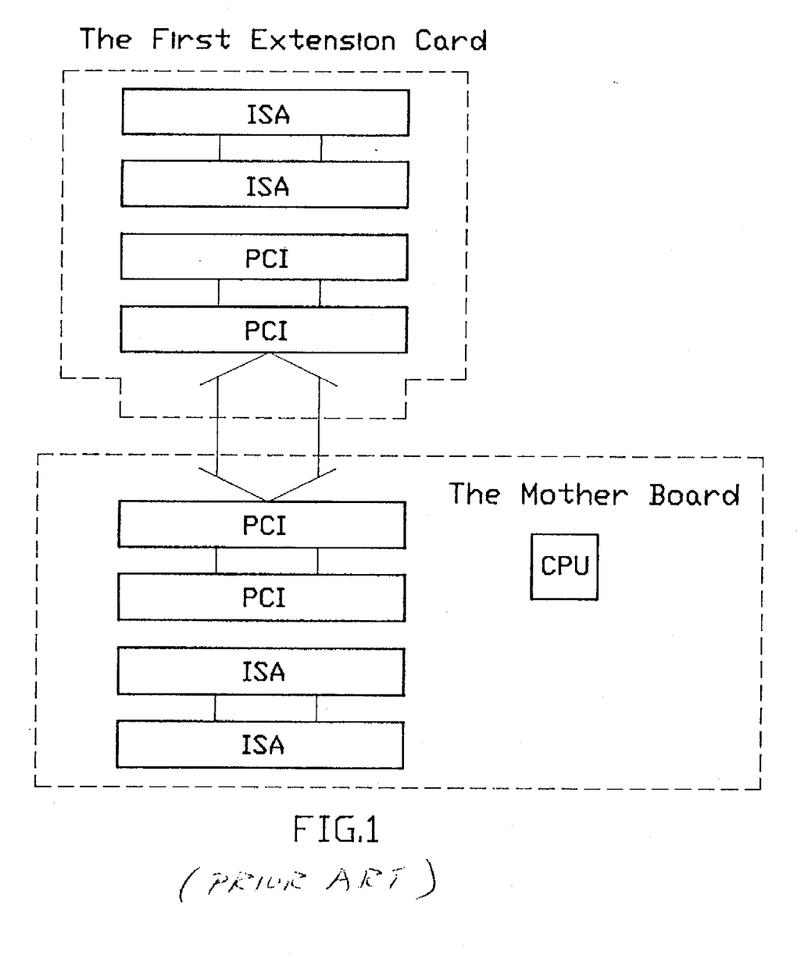
FIG. 1 shows the first extension card connected to the mother board according to the prior art.

Conventionally, the interface device which provides different bus ports includes a first extension card connected to the mother board. Following the development of high-technology, the functions of computers are relatively increased, and a variety of bus interface cards may be used and installed in the extension slots of the mother board. Due to the limitation of the internal space of the computer, only a limited number of bus interface cards can be installed. Under this condition, an extension card may be used for the connection of different bus interface cards to the mother board, so that the bus interface slots of the first extension card can obtain PCI, ISA bus signals for the bus interface cards. Because advances bus bars provide different functions including bus control arbitration, etc., PCI bus standards define the PCI extension slots of the mother board with respective exclusive signals. Because each PCI bus interface slot of the first extension card shown in FIG. 1 is connected to the same PCI extension slot of the mother board, the interface slots of the first extension card cannot provide the respective exclusive signals.

SUMMARY OF THE INVENTION

The present invention has been accomplished under the circumstances in view. According to the present invention, the bus port transmission device is provided for signal transmission between the first extension card and the mother board of a computer system, the device comprising at least one coupling device, each of the at least one coupling device including a first connector at one end connected to the contact for exclusive signal of one bus interface slot of the first extension card, a second connector connected to the exclusive signal of the corresponding extension slot of the mother board, wherein the signals of the extension slots of the mother board can be transmitted through the at least one coupling device to the interface slots of the first extension card, enabling the interface slots of the first extension card to provide the respective exclusive signals.

DETAILED DESCRIPTION OF THE PREFERRED EMBODIMENT

Figure 2:
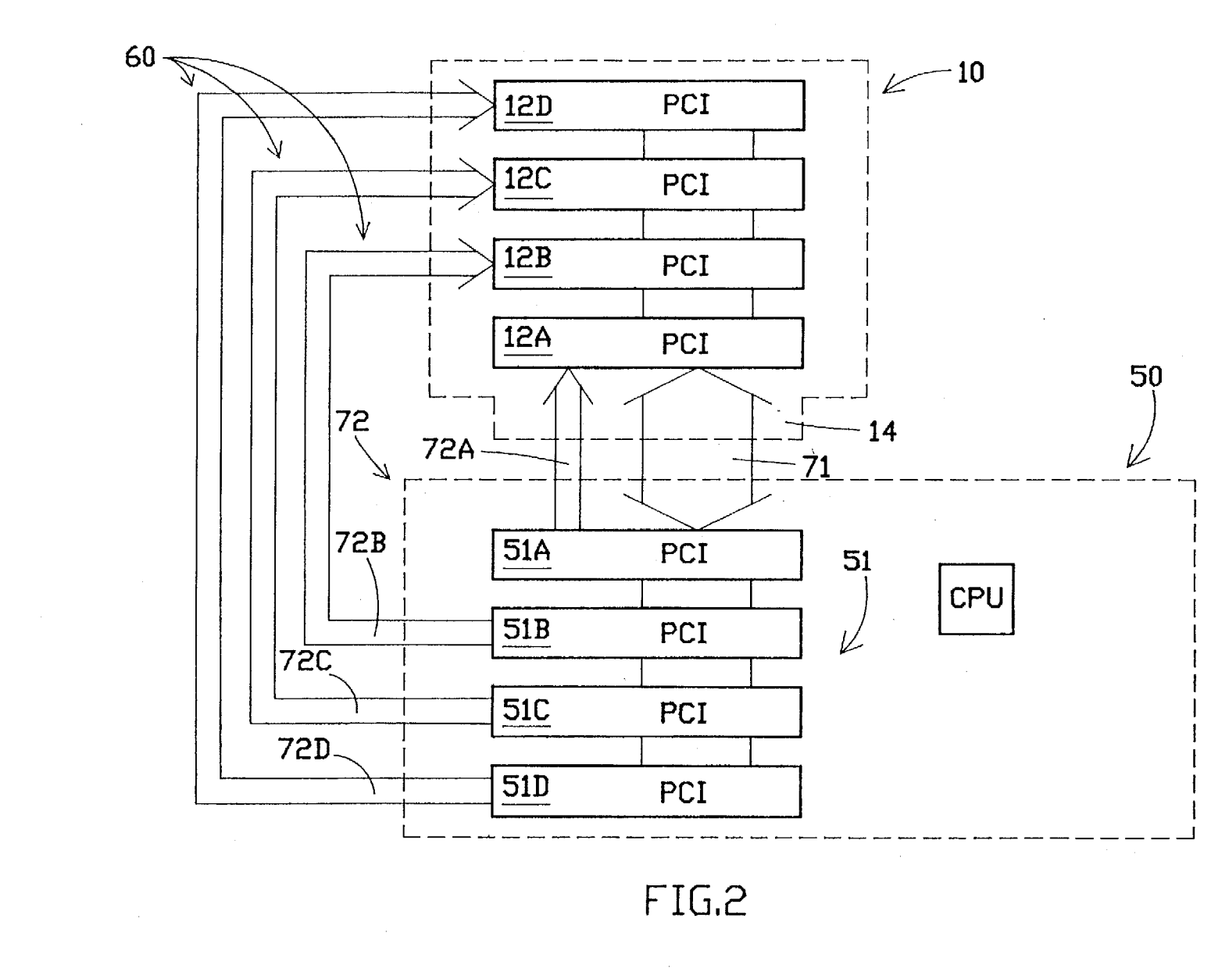
FIG. 2 is a schematic drawing showing the connection between the interface slots of the first extension card and the extension slots of the mother board according to the present invention.
Figure 3:
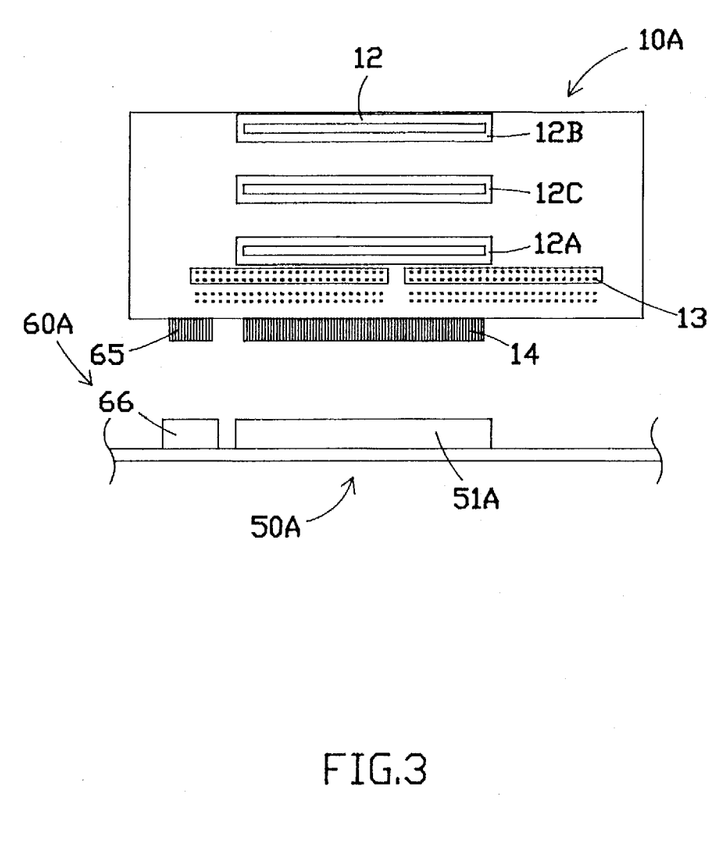
FIG. 3 shows a coupling device installed in the first extension card and the mother board according to the present invention.

Referring to FIGS. 2 and 3, the signals 70 of each of the PCI extension slots 51 of the mother board 50 include a common signal 71 and an exclusive signal 72 (PCI bus's INT A, INT B, INT C, INT D, REQ, GNT, IDSEL). When the insertion end 14 of the first extension card 10 is inserted into the extension slot 51A, all bus interface slots 12 of the first extension card 10 are connected to the common signal 71, however only the bus interface slot 12A is connected to the exclusive signal 72A of the extension slot 51A. Therefore, coupling devices 60 are needed to couple the bus interface slots 12B–D of the first extension card 10 to the exclusive signals 72B–D of the extension slots 51B–D of the mother board 50 so that the bus interface slots 12 of the first extension card 10 can correspond to the extension slots 51 of the mother board 50 and provide PCI bus signals 70. The number of the coupling device 60 is subject to the number of the interface slots 12 of the first extension card 10 and the number of the extension slots 51 of the mother board 50. For example, the first extension card 10 of FIG. 2 has four PCI bus interface slots 12A–D, the first extension card 10A of FIG. 3 has three PCI bus interface slots 12A–C. The first extension card 10 can be a raiser card/slot card, or an extension board. An extension board can be a horizontal extension board or vertical extension board, or an extension board of any of other suitable types.

Referring to FIG. 3, each coupling device 60A is comprised of a plug 65 mounted on the first extension card 10A, and a socket 66 mounted on the mother board 50 and adapted for receiving the plug 65.

Figure 4:
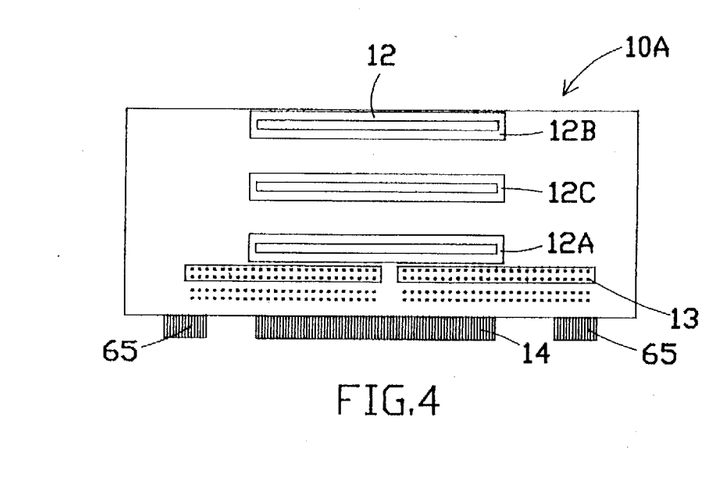
FIG. 4 shows another installation example of the first connectors of the coupling devices according to the present invention.
Figure 5:
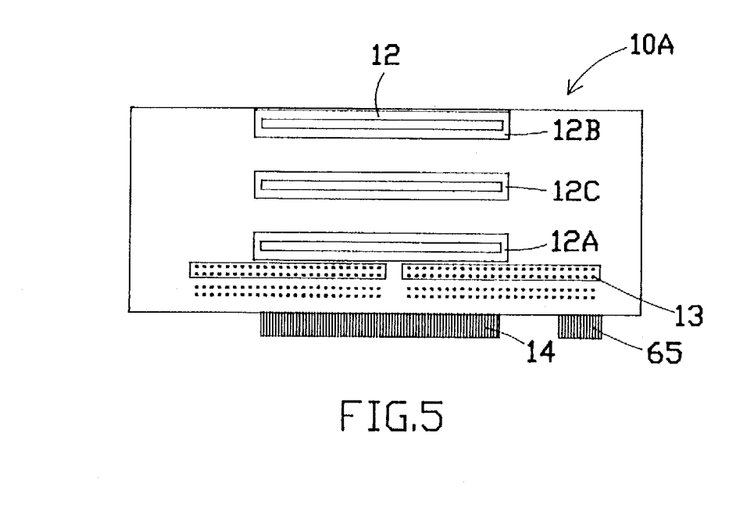
FIG. 5 shows still another installation example of the first connectors of the coupling devices according to the present invention.

Referring to FIGS. 4 and 5, the plugs 65 of all coupling devices 60A may be arranged at two opposite ends (see FIG.

4), or at one end (see FIG. 5). The plugs 65 are respectively connected to the respective contacts of the interface slots 12B–C to provide the respective exclusive signals 72B–C. The sockets 66 are respectively connected to the exclusive signals 72B–C of the extension slots 51B–C of the mother board 50A (except the extension slot 51A which is connected to the insertion end 14). When the plugs 65 are respectively connected to the sockets 66, the exclusive signals 72B–C are respectively transmitted to the interface slots 12B–C so that the interface slots 12B–C can provide the exclusive signals 72B–C.

Figure 6:
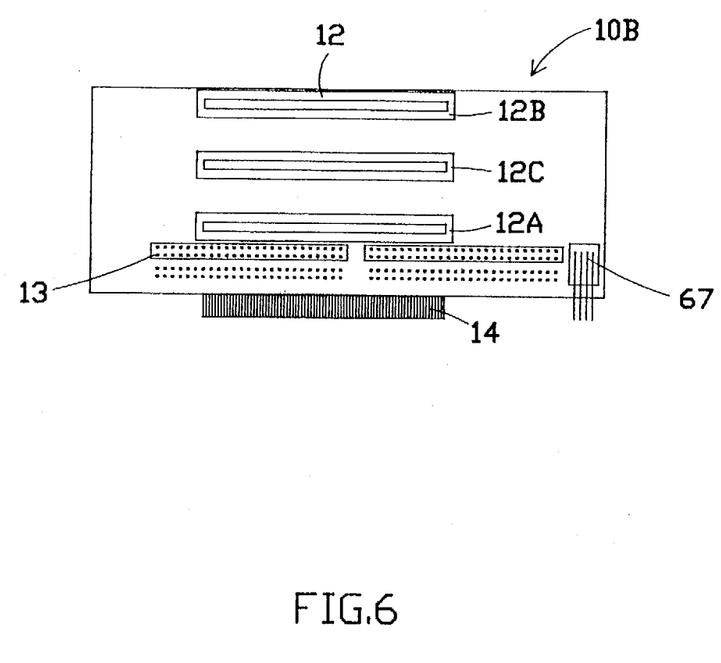
FIG. 6 shows an alternate form of the first connector according to the present invention.
Figure 7:
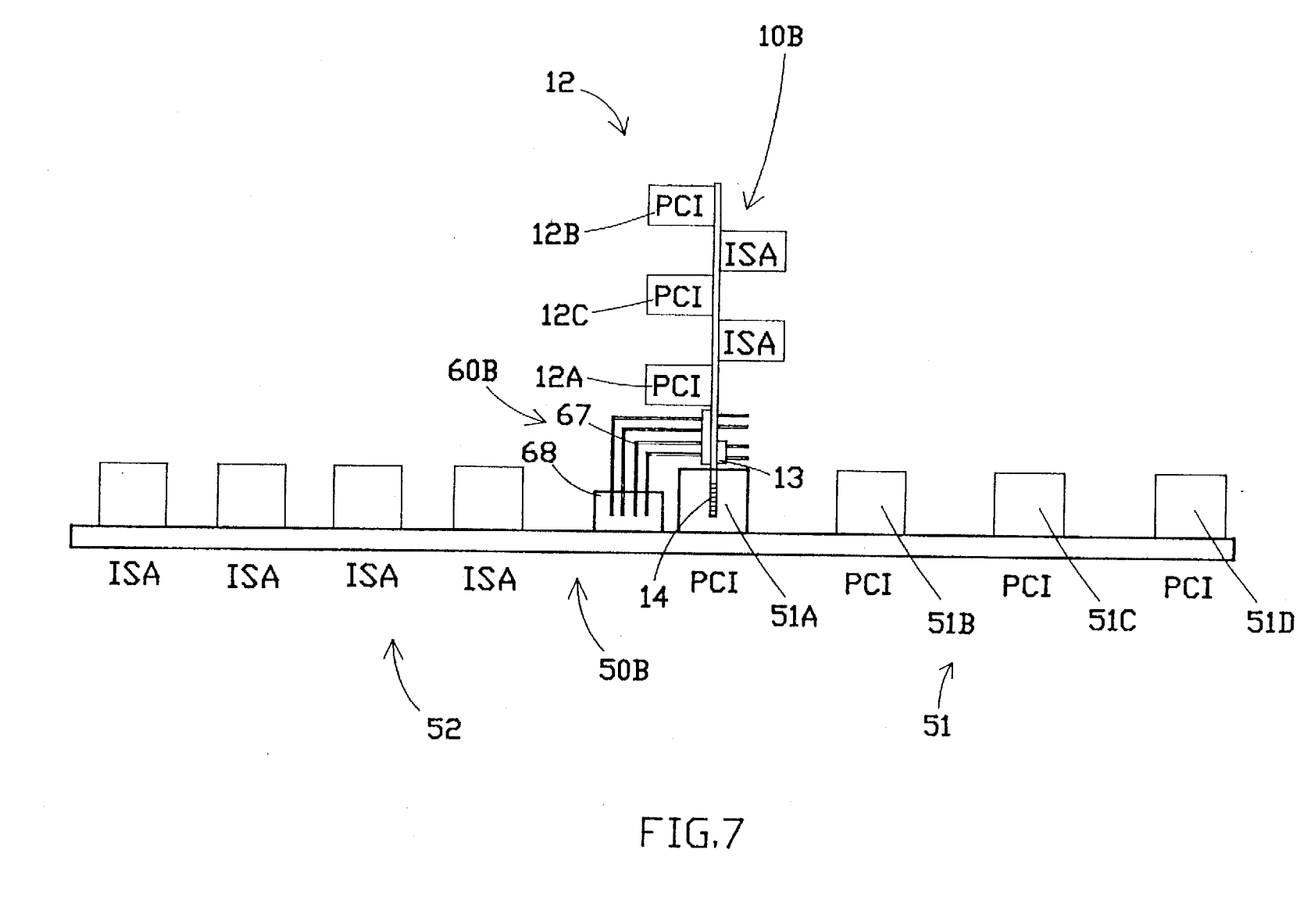
FIG. 7 is a schematic drawings showing the first connectors of the alternate form of FIG. 6 connected to the second connector on the mother board.

Referring to FIGS. 6 and 7, as an alternate form of the present invention, each coupling device 60B is comprised of a first connector 67 mounted on the first extension card 10B, and a second connector 68 mounted on the mother board SOB. The first connector 67 shown in FIG. 6 is a male connector. The second connector 68 shown in FIG. 7 is a female connector. Alternatively, the first connector 67 can be a female connector, and the second connector can be a male connector.

Figure 8:
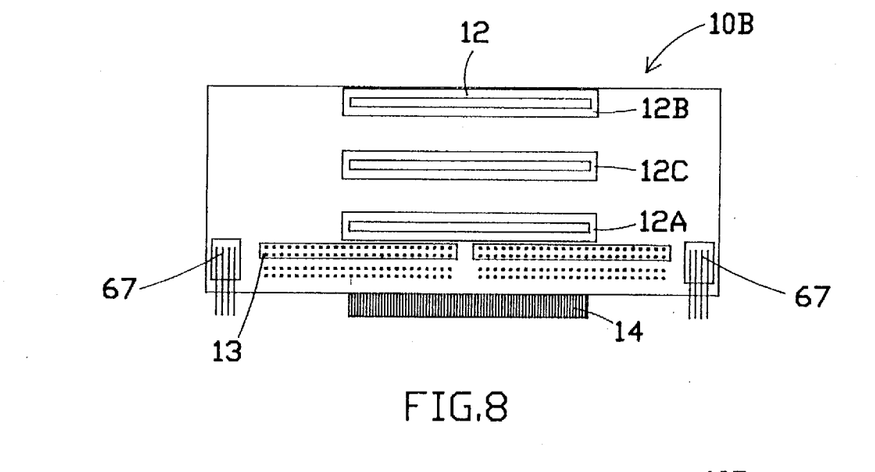
FIG. 8 shows another installation example of the first connectors of the coupling devices according to the alternate form of the present invention.
Figure 9:
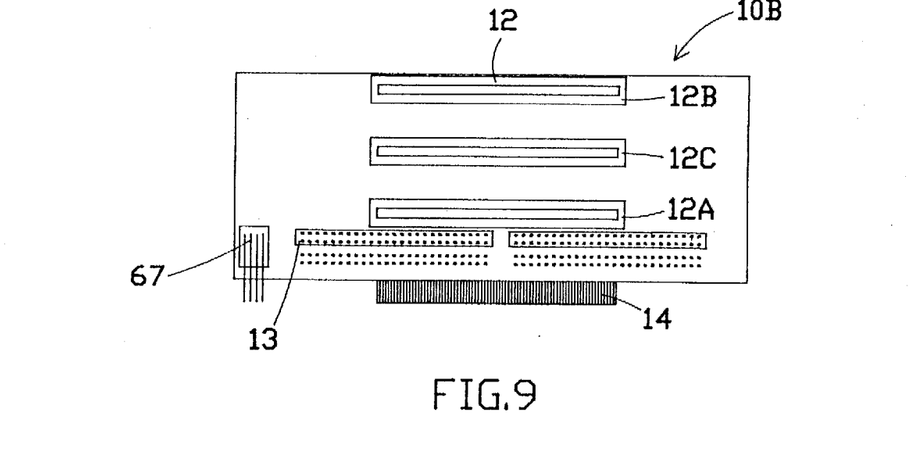
FIG. 9 shows still another installation example of the first connectors of the coupling devices according to the alternate form of the present invention.
Figure 10:
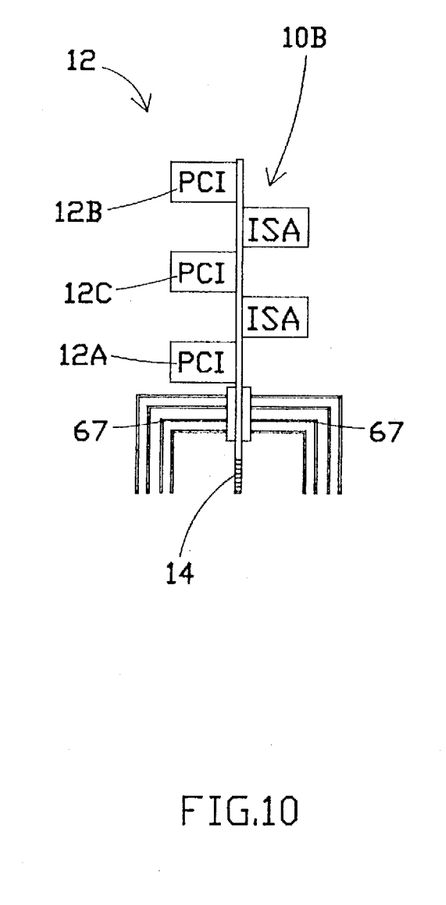
FIG. 10 shows still another installation example of the first connectors of the coupling devices according to the alternate form of the present invention.
Figure 11:
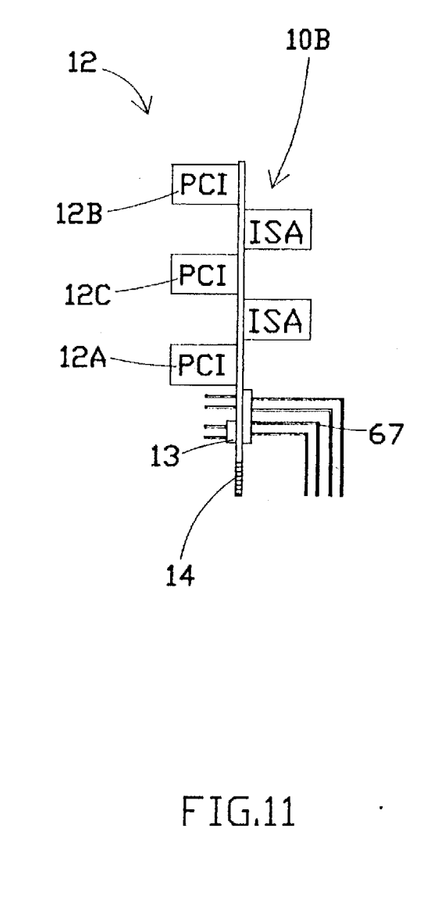
FIG. 11 shows a yet further installation example of the first connectors of the coupling devices according to the present invention.

The first connectors 67 of all coupling devices 60B may be arranged at two opposite ends (see FIG. 8), at one end (see FIG. 9), at two opposite sides (see FIG. 10), or at one side (see FIG. 11), and respectively connected to the respective contacts of the interface slots 12B–C to provide the respective exclusive signals 72B–C. The second connectors 68 are respectively connected to the exclusive signals 72B–C of the extension slots 51B–C of the mother board 50B. When the first connectors are respectively connected to the second connectors 68, the exclusive signals 72B–C of the extension slots 51B–C are respectively transmitted to the interface slots 12B–C so that the interface slots 12B–C can provide the exclusive signals 72B–C.

Figure 12:
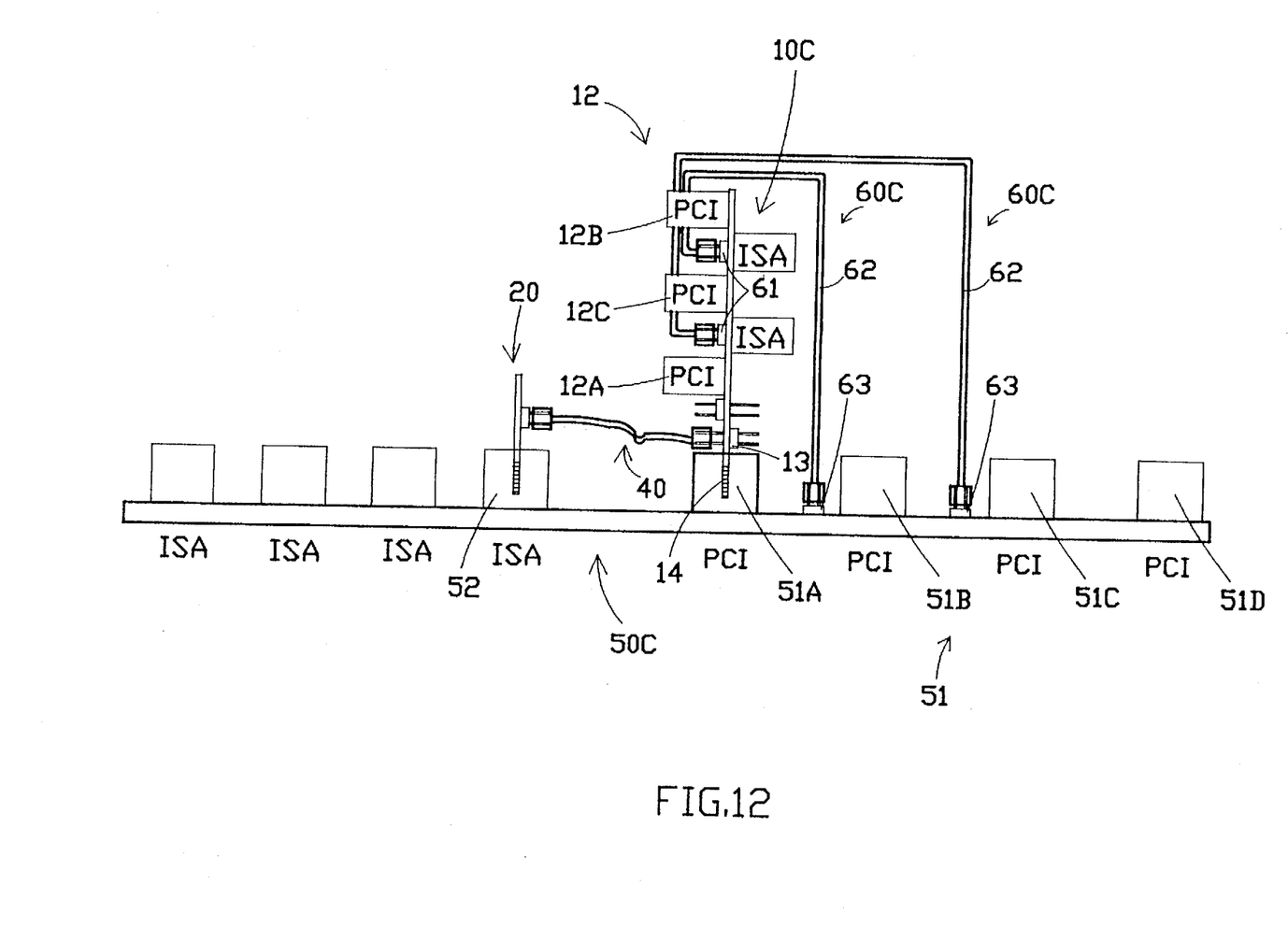
FIG. 12 shows still another alternate form of the coupling devices connected between the extension card and the mother board according to the present invention.

Referring to FIGS. 12, as another alternate form of the present invention, each coupling device 60C is comprised of a first connector 61, a cable 62, and a second connector 63. The first connectors 61 of all coupling devices 60C are mounted on the first extension card 10B and connected to the respective contacts of the interface slots 12B–C. The second connectors 63 of all coupling devices 60C are mounted on the mother board 50B and respectively connected to the extension slots 51B–C. The cable 62 has two connectors at two opposite ends adapted for connecting to the first connectors 61 and the second connectors 63 respectively. Therefore, the exclusive signals 72B–C of the extension slots 51B–C can be transmitted through the coupling devices 60C to the interface slots 12B–C of the first extension card 10C, enabling the interface slots 12B–C to provide the respective exclusive signals 72B–C.

Figure 13:
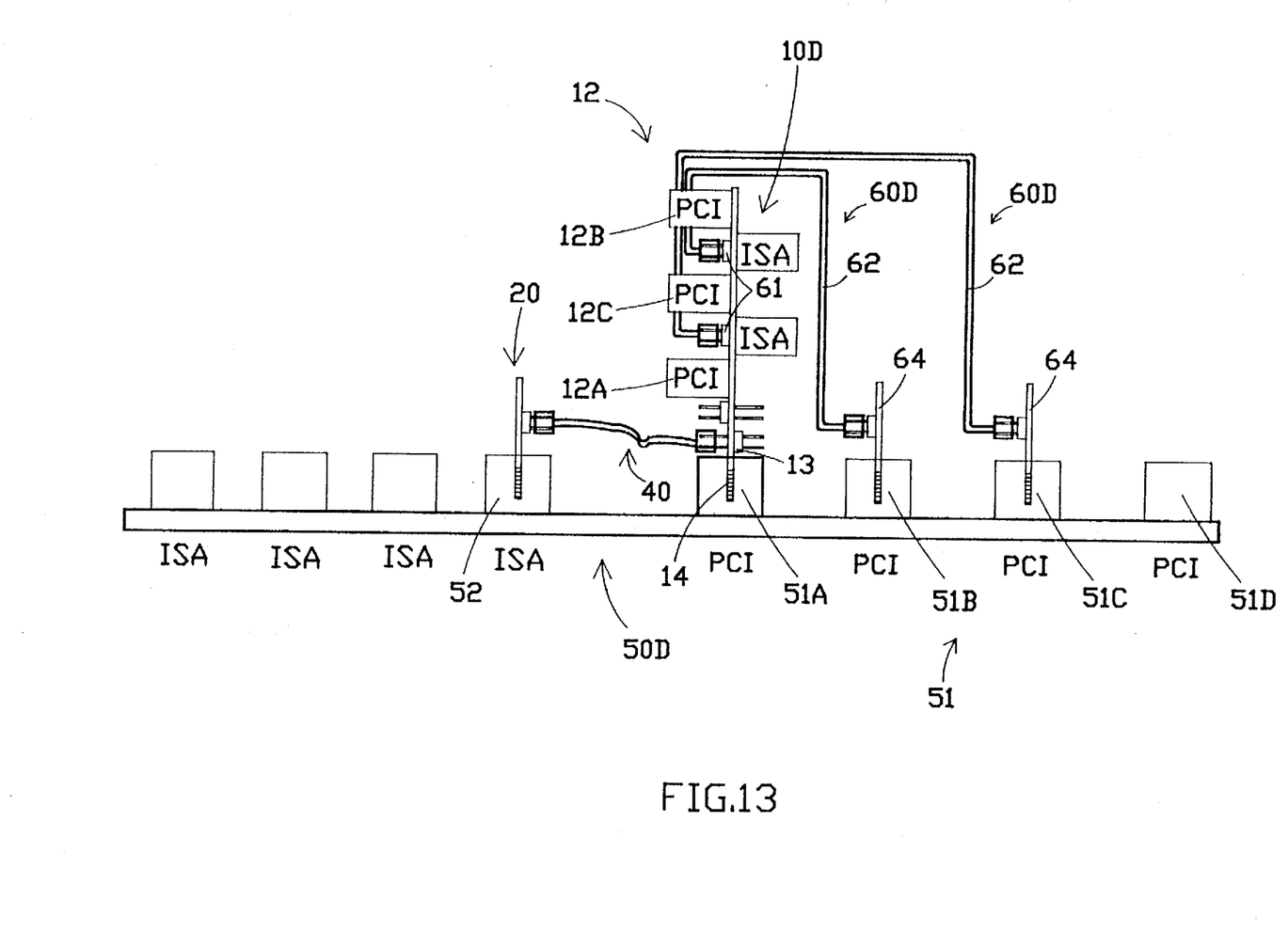
FIG. 13 shows still another alternate form of the coupling devices connected between the first extension card and the mother board according to the present invention.
Figure 14:
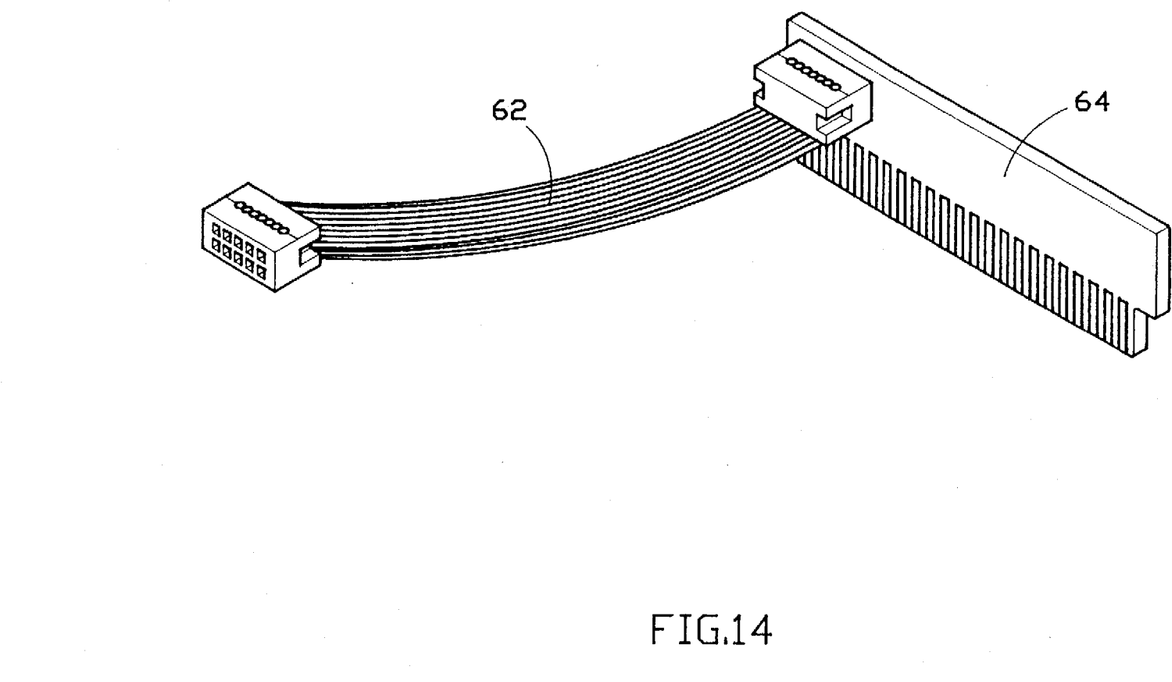
FIG. 14 is an elevational view of still another alternate form of the coupling device according to the present invention.
Figure 15:
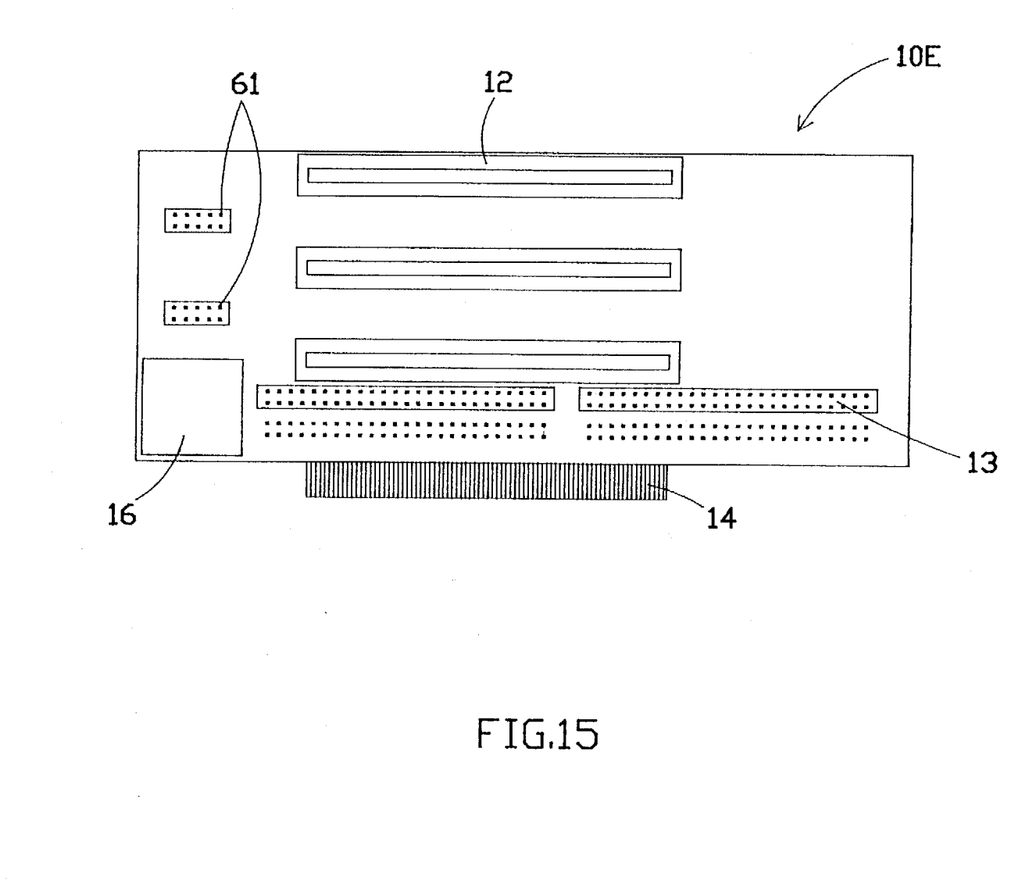
FIG. 15 is a plain view showing an alternate form of the first extension card according to the present invention.

Referring to FIGS. 13, as still another alternate form of the present invention, each coupling device 60D is comprised of a connector 61, a cable 62, and a connecting card 64. The connecting card 64 has a connector for the connection of the cable 62, and can be plugged into one of the extension slots 51B–C of the mother board 50D. The connector 61 (which is identical to the first connector 61 shown in FIG. 12) is mounted on the first extension card 10B and connected to the respective contacts of the interface slots 12B–C. When all coupling devices 60D are installed, the exclusive signals 72B–C of the extension slots 51B–C can be transmitted through the coupling devices 60D to the interface slots 12B–C of the first extension card 10C, enabling the interface slots 12B–C to provide the respective exclusive signals 72B–C. If the first extension card 10 is a raised card or slot card 10, it must have an opening 16 for the passing of the cables 62 of the aforesaid coupling devices 60 (see FIG. 15). If the first extension card 10 is a horizontal extension board, it can have four PCI bus interface slots 12A–D as shown in FIG. 2.

Figure 16:
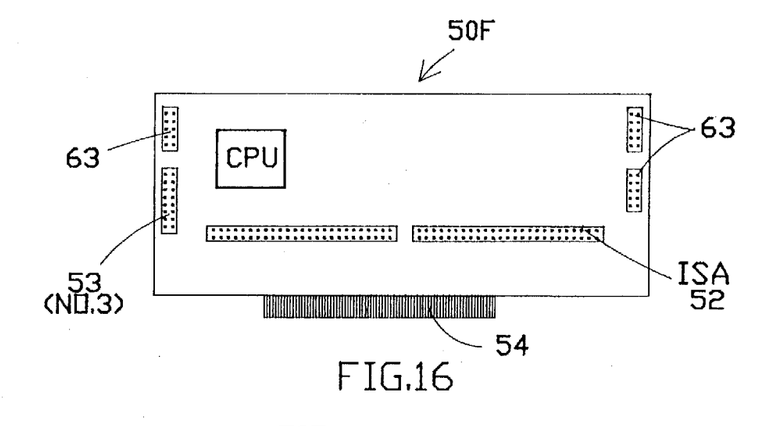
FIG. 16 is a plain view showing an alternate form of the mother board according to the present invention.
Figure 17:
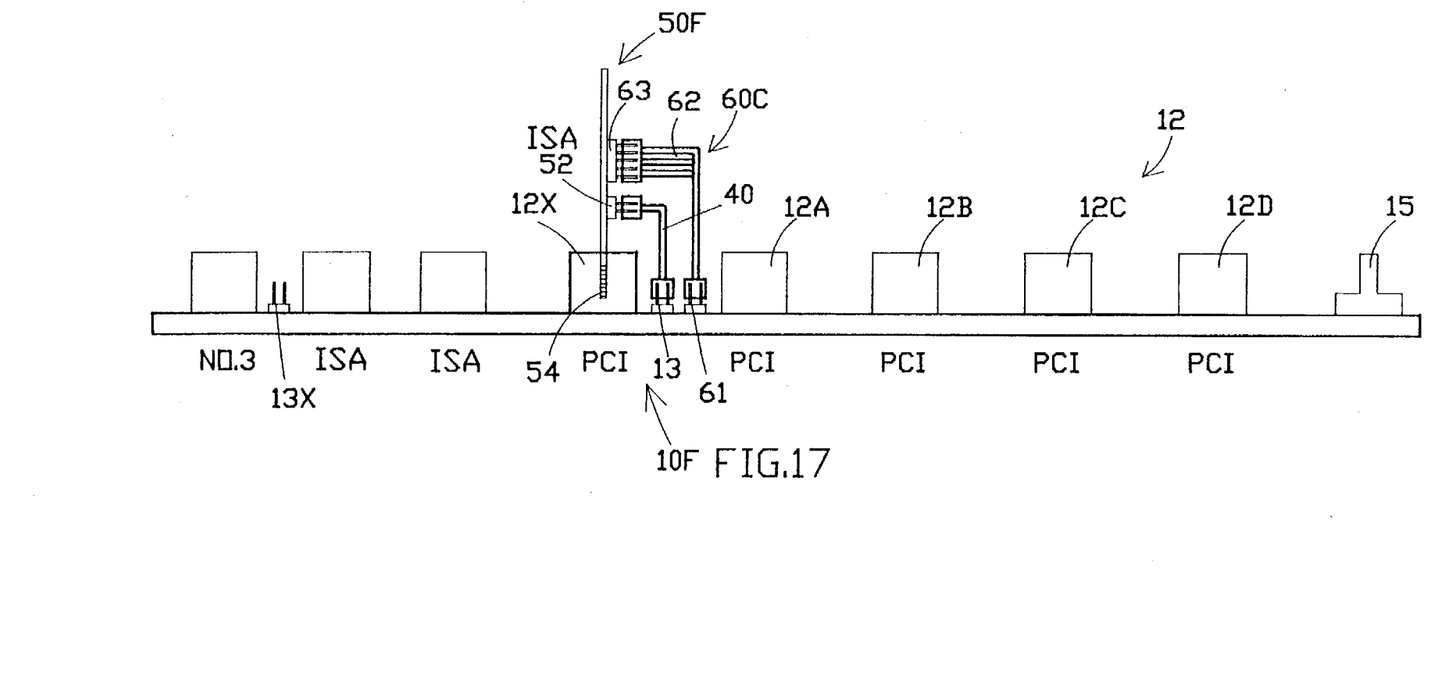
FIG. 17 shows still another alternate form of the coupling devices connected between the first extension card and the mother board according to the present invention.

Referring to FIGS. 16 and 17, the first extension card 10F has a bus interface slot 12X for connection to the insertion end 54 of a raiser card type mother board 50F (for example, a CPU card), in which the contacts of the bus interface slot 12X are respectively connected to that of the bus interface slot 12A, i.e., the bus interface slot 12X and the bus interface slot 12A have the same bus signals 70. Each of the coupling devices 60C is comprised of a first connector 61, a cable 62, and a second connector 63. The first connectors 61 of all coupling devices 60C are mounted on the first extension card 10F and respectively connected to the contact for exclusive signals B–D of the bus interface slots 12B–D (except the bus interface slot 12X and the bus interface slot 12A). The second connector 63 is mounted on the mother board 50F and connected to the contacts for exclusive signals 72B–D of the PCI bus (except the exclusive signal 72A outputted from the insertion end 54). Therefore, the PCI bus exclusive signals 72B–D of the mother board 50F can be transmitted through the coupling devices 60C to the bus interface slots 12B–D of the first extension card 10F, enabling the bus interface slots 12B–D to provide the exclusive signals 72B–D. A power connector 15 may be installed in the first extension card 10F for connection to the power supply unit, so that power supply can be provided to the mother board 50F and the related interface cards. The third bus signals of the mother board 50F may be transmitted from the connector 53 at the mother board 50F to the connector 13X at the first extension card 10F through a cable.

Figure 18:
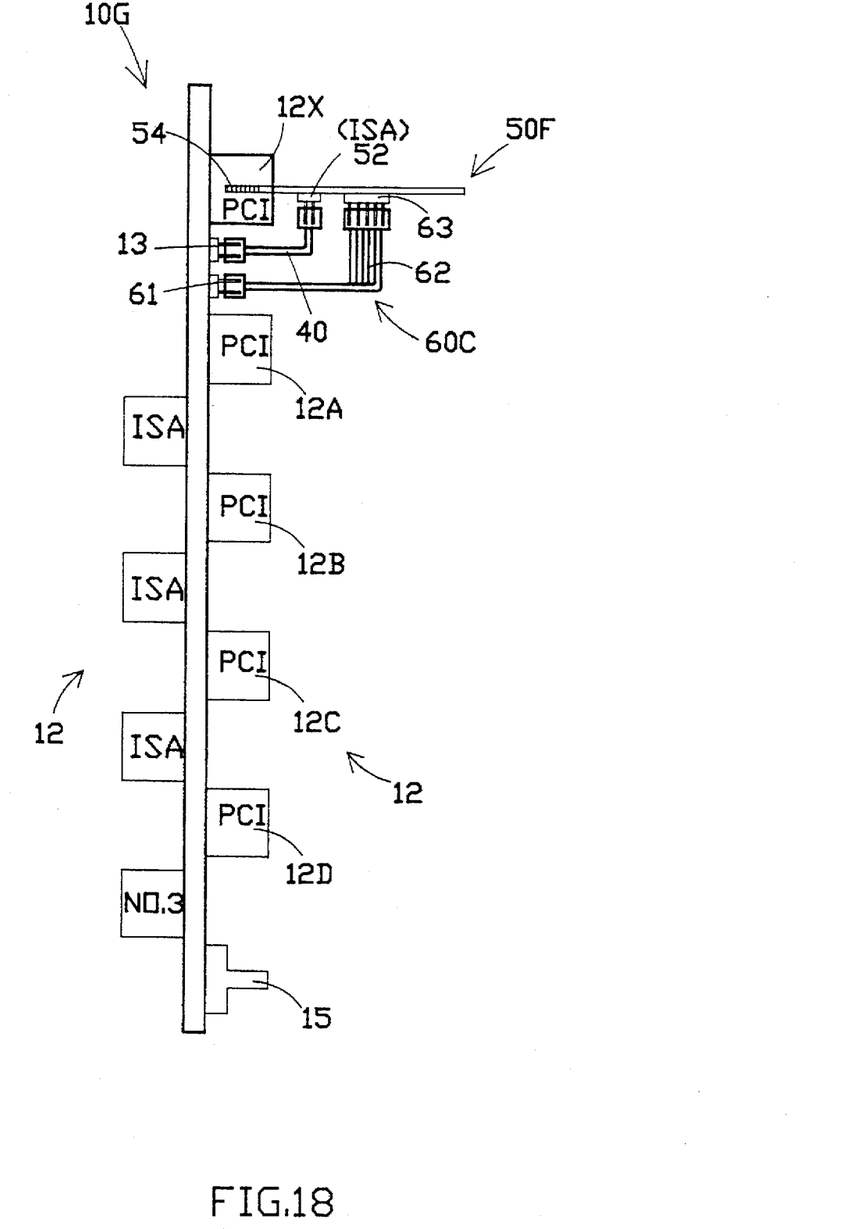
FIG. 18 shows a yet further alternate form of the coupling devices connected between the first extension card and the mother board according to the present invention.

Referring to FIG. 18, the first extension card 10G shown is a vertical extension board. The bus interface slots 12 are mounted on the first extension card 10G at suitable locations. An additional bus interface slot 12X is mounted on the first extension card 10G for connection to the insertion end 54 of the raiser card type mother board 50F. A power connector 15 may be installed in the first extension card 10G for connection to the power supply unit. The first connectors 61 of the coupling devices 60C are respectively mounted on the first extension card 10G, the second connectors 63 thereof are respectively mounted on the mother board 50F, and the cables 62 thereof are respectively connected between the first connectors 61 and the second connectors 63. The bus signals 70 outputted from the insertion end 54 of the mother board 50F are transmitted through the interface slot 12X to the interface slots 12A; the interface slots 12B–D obtain from the insertion end 54 only the PCI bus common signal 71. Therefore, the bus interface slots 12B–D must be connected to the mother board 50F by the coupling devices 60C so as to obtain the PCI bus exclusive signals 72 from the mother board 50F. The additional bus interface slot 12X may be eliminated when the mother board 50F is directly connected to the bus interface slots 12A. However, this arrangement occupies one PCI bus interface slot 12, and one PCI interface card mounting position is diminished. Furthermore, the coupling devices 60A or 60B may be used instead of the coupling devices 60C, for connection between an extension board type first extension card 10 and the mother board 50F.

It is to be understood that various modifications and changes could be made without departing from the spirit and scope of the invention disclosed.

What the invention claimed is:

1. A bus port transmission device for signal transmission between a first extension card and a mother board of a computer system, comprising at least one coupling device, each coupling device having one end connected to a contact for an exclusive signal of one bus interface slot of the first extension card, and an opposing end connected to an exclusive signal contact of a corresponding extension slot of the mother board, the at least one coupling device including (a) first connector means mounted on the first extension card and connected to the bus interface slot, (b) second connector means mounted on the mother board and connected to the extension slot, the first connector means of said at least one coupling device is connected to the contact for the exclusive signal of a corresponding bus interface slot of the first extension card, and the second connector means of said at least one coupling device is connected to the exclusive signal contact of the corresponding extension slot of the mother board, and (c) a cable connected between the first connector means and the second connector means.

2. A bus port transmission device for signal transmission between a first extension card and a mother board of a computer system, comprising at least one coupling device, each coupling device having one end connected to a contact for an exclusive signal of one bus interface slot of the first extension card, and an opposing end connected to an exclusive signal contact of a corresponding extension slot of the mother board, the at least one coupling device including (a) first connector means mounted on the first extension card and connected to the bus interface slot, the first connector means of said at least one coupling device is a connector connected to the contact for the exclusive signal of a corresponding bus interface slot of the first extension card, (b) second connector means mounted on the mother board and connected to the extension slot, and (c) a cable connected between the first connector means and the second connector means, the second connector means of said at least one coupling device is a connecting card connected to the exclusive signal contact of the corresponding extension slot of the mother board for transmission of the exclusive signal from the mother board to the first extension card through the cable and the first connector means.

3. The bus port transmission device of claim 2 wherein the cable of said at least one coupling device has two connectors at two opposite ends respectively connected to the first connector means and second connector means of the at least one coupling device.

* * * * *